United States Patent
Takeda et al.

(10) Patent No.: US 11,037,823 B2
(45) Date of Patent: Jun. 15, 2021

(54) METHOD OF MANUFACTURING SEMICONDUCTOR DEVICE

(71) Applicant: KOKUSAI ELECTRIC CORPORATION, Tokyo (JP)

(72) Inventors: Tsuyoshi Takeda, Toyama (JP); Naofumi Ohashi, Toyama (JP); Toshiyuki Kikuchi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 346 days.

(21) Appl. No.: 15/965,457

(22) Filed: Apr. 27, 2018

(65) Prior Publication Data

US 2018/0315651 A1    Nov. 1, 2018

(30) Foreign Application Priority Data

Apr. 27, 2017 (JP) .............................. JP2017-088378

(51) Int. Cl.
*H01L 21/768* (2006.01)
*C23C 16/32* (2006.01)
(Continued)

(52) U.S. Cl.
CPC ...... *H01L 21/76885* (2013.01); *C23C 16/325* (2013.01); *C23C 16/45525* (2013.01);
(Continued)

(58) Field of Classification Search
CPC ...................... H01L 21/7682; H01L 21/76885
See application file for complete search history.

(56) References Cited

U.S. PATENT DOCUMENTS 9,153,538 B2 * 10/2015 Ko ..................... H01L 23/5329
2005/0184397 A1 * 8/2005 Gates ................ H01L 21/76826
257/774
(Continued)

FOREIGN PATENT DOCUMENTS

JP       07-297183 A    11/1995
JP    2009-032956 A     2/2009
(Continued)

OTHER PUBLICATIONS

Taiwanese Office Action dated Feb. 20, 2019 for the Taiwanese Patent Application No. 107114281.
(Continued)

*Primary Examiner* — Angel Roman
(74) *Attorney, Agent, or Firm* — Volpe Koenig

(57) ABSTRACT

Described herein is a technique capable of providing a semiconductor device having good characteristics. According to the technique described herein, there is provided a method of manufacturing a semiconductor device, including: (a) loading a substrate into a process chamber; and (b) forming a stacked etch stopper film by performing: (b-1) forming a first etch stopper film containing a first element and a second element by supplying a first element-containing gas and a second element-containing gas onto the substrate; and (b-2) forming a second etch stopper film containing the first element, the second element and a third element by supplying the first element-containing gas, the second element-containing gas and a third element-containing gas onto the first etch stopper film.

20 Claims, 12 Drawing Sheets

(51) Int. Cl.
  *H01L 21/02* (2006.01)
  *C23C 16/455* (2006.01)
  *H01L 23/532* (2006.01)
  *H01L 23/522* (2006.01)

(52) U.S. Cl.
  CPC .... *H01L 21/0228* (2013.01); *H01L 21/02167* (2013.01); *H01L 21/02211* (2013.01); *H01L 21/02274* (2013.01); *H01L 21/7682* (2013.01); *H01L 21/76816* (2013.01); *H01L 21/76832* (2013.01); *H01L 23/5222* (2013.01); *H01L 23/53295* (2013.01)

(56) References Cited

U.S. PATENT DOCUMENTS

| | | | |
|---|---|---|---|
| 2009/0093100 A1* | 4/2009 | Xia | H01L 21/76807 438/421 |
| 2009/0230558 A1 | 9/2009 | Matsuoka | |
| 2011/0001216 A1 | 1/2011 | Inoue | |
| 2012/0261798 A1 | 10/2012 | Inoue | |
| 2012/0280398 A1* | 11/2012 | Clevenger | H01L 21/02282 257/770 |
| 2015/0111395 A1 | 4/2015 | Hashimoto et al. | |
| 2016/0027726 A1 | 1/2016 | Zhu et al. | |
| 2016/0118335 A1* | 4/2016 | Lee | H01L 23/53238 257/774 |
| 2020/0144106 A1* | 5/2020 | LiCausi | H01L 21/76834 |

FOREIGN PATENT DOCUMENTS

| | | |
|---|---|---|
| JP | 2009-218585 A | 9/2009 |
| JP | 2011-014731 A | 1/2011 |
| JP | 2014-072228 A | 4/2014 |
| JP | 2017-069461 A | 4/2017 |

OTHER PUBLICATIONS

Japanese Office Action dated Aug. 29, 2018 for the Japanese Patent Application No. 2017-088378.
Korean Office Action dated Apr. 16, 2019 for the Korean Patent Application No. 10-2018-0045401.

* cited by examiner

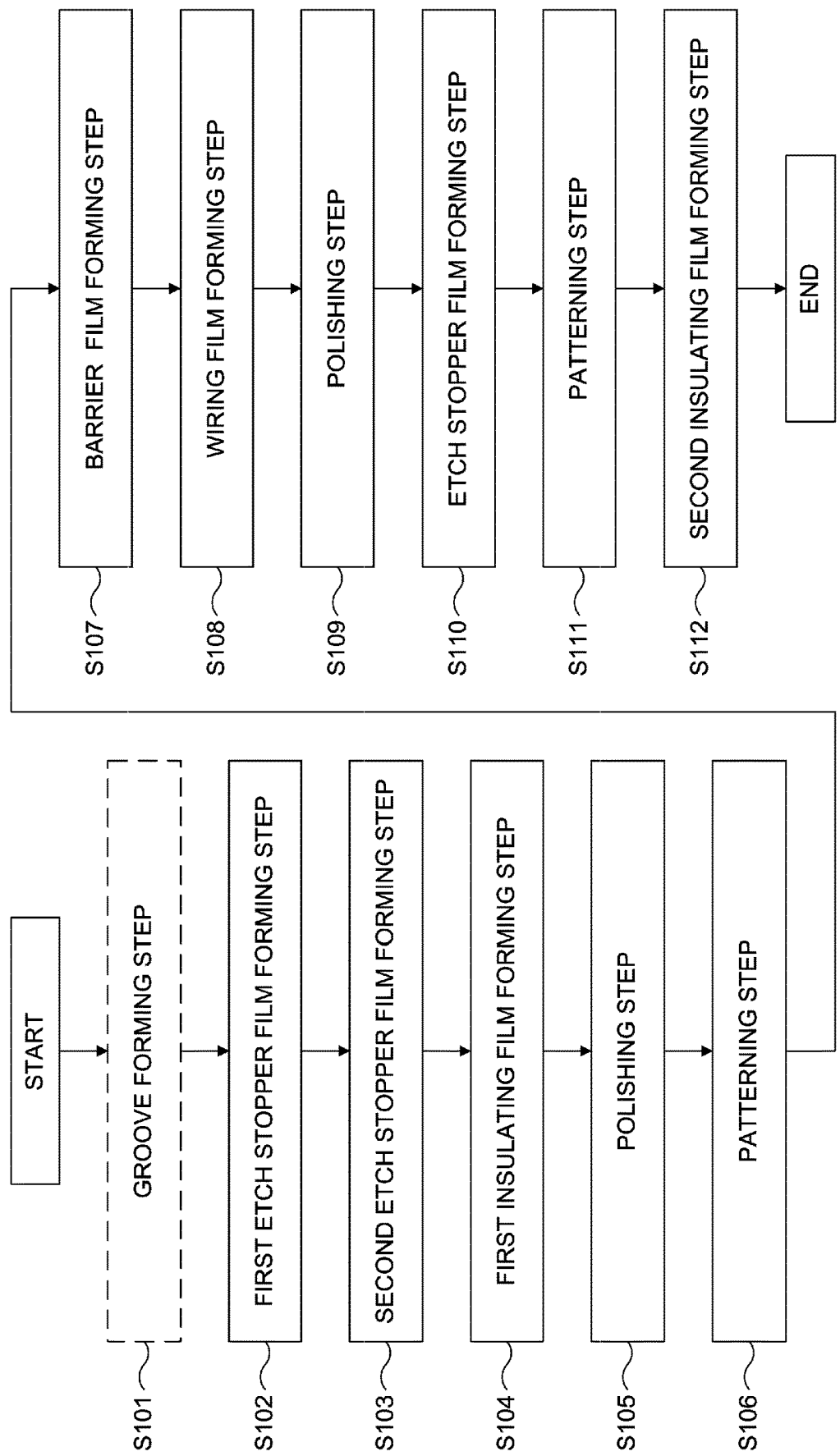

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2017-088378, filed on Apr. 27, 2017, the entire contents of which are hereby incorporated by reference.

BACKGROUND

1. Field

The present disclosure relates to a method of manufacturing a semiconductor device.

2. Description of the Related Art

Recently, semiconductor devices are integrated at high density. As a result, the distance between wirings is reduced. Accordingly, the electrical capacitance between the wirings increases and the propagation speed of the signal becomes slower. Therefore, it is necessary that the dielectric constant between wirings as low as possible.

An air gap structure having a gap between wirings has been developed as one of the methods for reducing the dielectric constant. For example, the gap of the air gap structure may be formed between the wirings by etching the semiconductor devices.

When the width of the wirings and the width between the wirings are reduced, the wirings may collapse. As a result, the device characteristics of the semiconductor devices may deteriorate.

SUMMARY

Described herein is a technique capable of providing a semiconductor device having good characteristics.

According to one aspect of the technique described herein, there is provided a method of manufacturing a semiconductor device, including: (a) loading a substrate into a process chamber; and (b) forming a stacked etch stopper film by performing: (b-1) forming a first etch stopper film containing a first element and a second element by supplying a first element-containing gas and a second element-containing gas onto the substrate; and (b-2) forming a second etch stopper film containing the first element, the second element and a third element by supplying the first element-containing gas, the second element-containing gas and a third element-containing gas onto the first etch stopper film.

BRIEF DESCRIPTION OF THE DRAWINGS

FIG. 1 is a flowchart illustrating a manufacturing process of a semiconductor device according to an embodiment described herein.

DETAILED DESCRIPTION

Embodiments

Figure 2A:
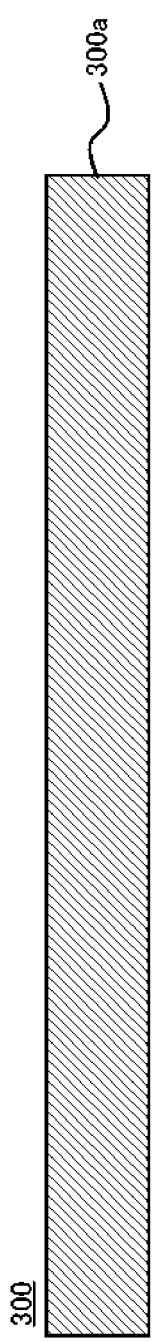
FIGS. 2A through 2D illustrate cross-sectional views of a substrate corresponding to steps S101 through S104 of FIG. 1 according to the embodiment.

Hereafter, embodiments will be described.

Embodiment

Hereafter, an embodiment will be described.

A manufacturing process of a semiconductor device will be described with reference to FIGS. 1 through 6B. FIG. 1 is a flowchart illustrating the manufacturing process of the semiconductor device according to the embodiment. FIGS. 2A through 6B illustrate cross-sectional views of a substrate corresponding to each steps of FIG. 1, respectively.

<Groove Forming Step S101>

The groove forming step S101 will be described. The groove forming step S101 will be described in detail with reference to FIGS. 2A and 2B. First grooves are formed on the surface of a surface layer 300a of a substrate 300. The surface layer 300a may refer to only an insulating film formed on the substrate 300, only the silicon substrate serving as the substrate 300 or both. The insulating film includes, for example, a carbon-containing silicon oxide film (SiOC film). The first grooves 301 are formed with a patterning technique. In the groove forming step S101, the heights 301H (depths) of the first grooves 301 are greater than the sum of the thickness (302aH) of a first etch stopper film 302a and the thickness (302bH) of a second etch stopper film 302b. The heights 301H of the first grooves 301 are smaller than the height of a copper film (also referred to as "Cu film") 306b. The first etch stopper film 302a and the second etch stopper film 302b are also referred to as "first ES film 302a" and "second ES film 302b", respectively. Similarly, a first etch stopper film forming step S102 and a second etch stopper film forming step S103, which will be described later, are also referred to as "first ES film forming step S102" and "second ES film forming step S103", respectively. Preferably, the heights 301H of the first grooves 301 are greater than the sum of the thickness (302aH) of the first ES film 302a, the thickness (302bH) of the second ES film 302b and the thickness of a barrier film 305 described later, and are smaller than half of the height of the Cu film 306b. In the embodiment, the shape of the first grooves 301 is exemplified as rectangular. However, the shape of the first grooves 301 is not limited thereto and the first grooves 301 may have any concave shape with respect to the surface layer 300a. For example, the first grooves 301 may have a shape such as a hemispherical shape, a conical (bowl-like) shape and a triangular pyramid shape.

Figure 2B:
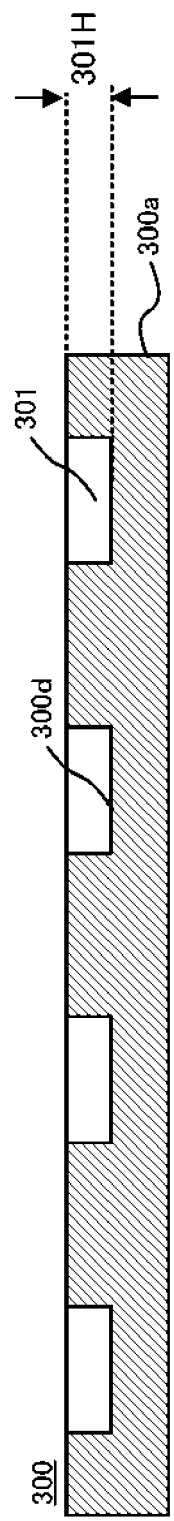
Figure 2C:
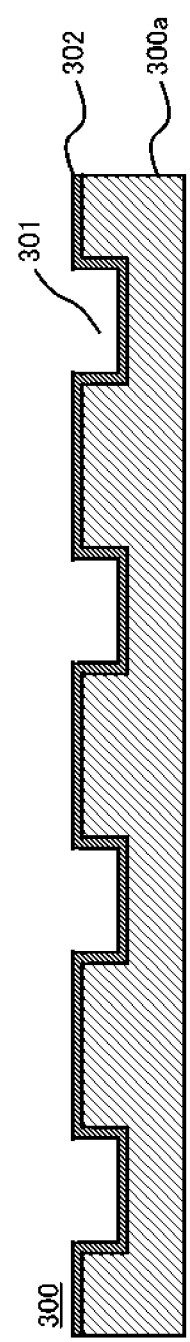

After forming the first grooves 301, an etch stopper film 302 is formed on the surface of the substrate. The etch stopper film 302 is also referred to as "ES film 302". FIG. 2C illustrates a cross-sectional view of the substrate 300 with the etch stopper film 302 formed thereon.

The inventors of the present application have discovered that the etch stopper film is effective in suppressing the variation in the depth of air gaps when forming the pattern of the air gaps. However, if the etch stopper film continues to exist in the final device structure, the parasitic capacitance between the wirings of the semiconductor device increases so that the device characteristics of the semiconductor device become uneven. The inventors of the present application have confirmed that the above-described problems can be suppressed by stacking two types of etch stopper films. In the embodiment, the upper etch stopper film of the two types of etch stopper films may be removed eventually. By stacking two types of etch stopper films, the parasitic capacitance between the wirings of the semiconductor device can be reduced. Hereinafter, a method of manufacturing semiconductor device including forming two types of etch stopper films will be described. Instead of removing only the upper etch stopper film, it is also possible to remove both the two types of etch stopper films in order to reduce the parasitic capacitance between the wirings of the semiconductor device.

Figure 3:
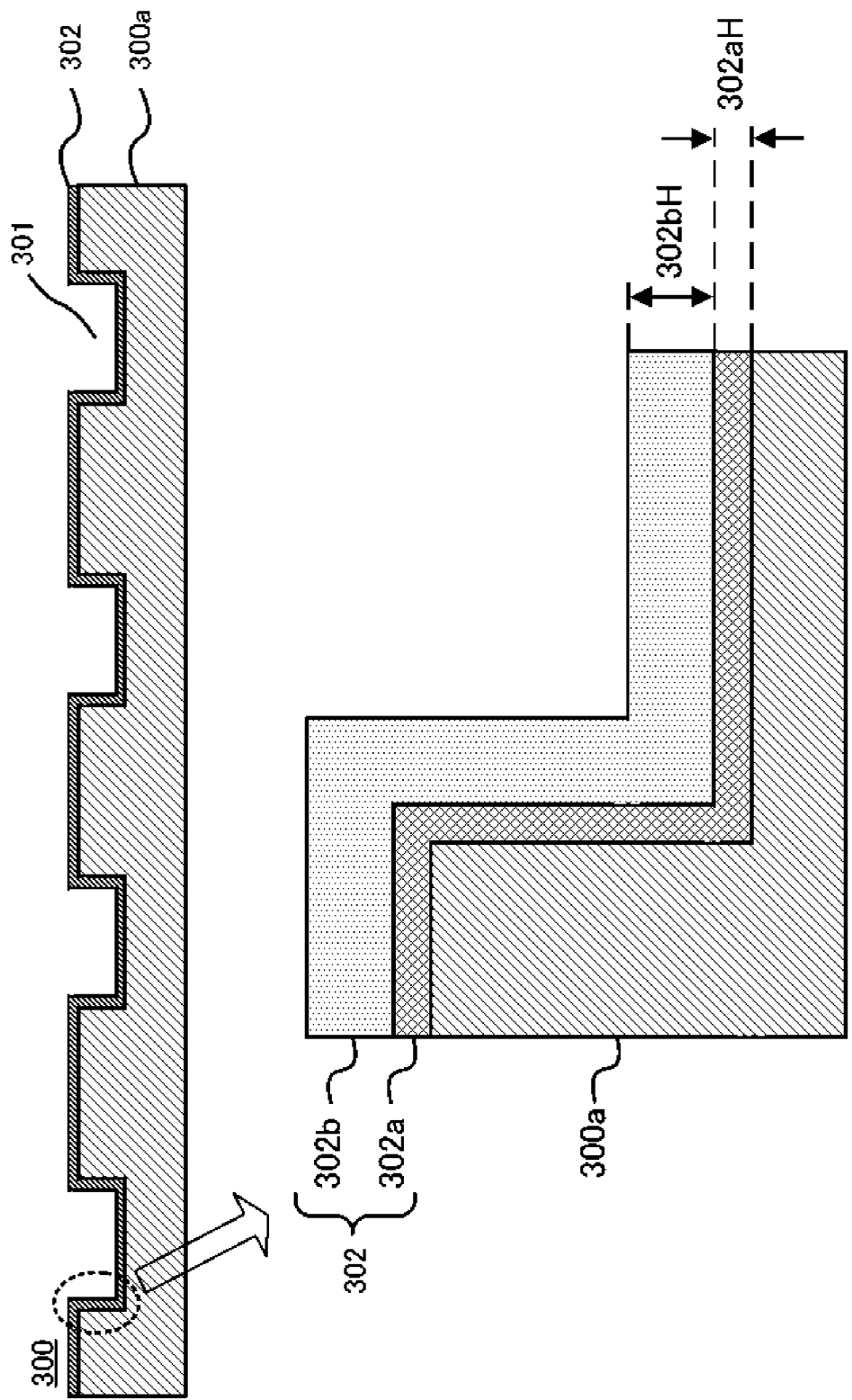
FIG. 3 is an enlarged view of a circled portion of the substrate of FIG. 2C.

Next, a technique for forming the ES film 302 including the first ES film 302a and the second ES film 302b will be described in detail with reference to FIGS. 1 and 3. A substrate processing apparatus 100 preferably used in the embodiment and the method of forming the first ES film 302a and the second ES film 302b using the substrate processing apparatus 100 will be described later.

<First Etch Stopper Film Forming Step S102>

The first ES film 302a is formed on the surface layer 300a of the substrate 300. In the first etch stopper film forming step S102, the first ES film 302a includes, for example, a carbon-containing silicon film (also referred to as "SiC film"). The thickness 302aH of the first ES film 302a is smaller than the thickness 302bH of the second ES film 302b described later. For example, the thickness 302aH of the first ES film 302a may range from 1 Å to 10 Å.

<Second Etch Stopper Film Forming Step S103>

The second ES film 302b is formed on the first ES film 302a. In the second etch stopper film forming step S103, the second ES film 302b includes, for example, a carbon-containing silicon nitride film (also referred to as "SiCN film"). The thickness 302bH of the second ES film 302b is greater than the thickness 302aH of the first ES film 302a described above. For example, the thickness 302bH of the second ES film 302b may range from 11 Å to 50 Å. Thus, the ES film 302 is formed by forming the first ES film 302a and the second ES film 302b.

As described above, by configuring such that the elements constituting the first ES film 302a are different from the elements constituting the second ES film 302b or the thickness of the first ES film 302a is different from the thickness of the second ES film 302b, the following one or more advantageous effects can be achieved.

(a) By making the elements constituting the first ES film 302a different from the elements constituting the second ES film 302b, the etching selectivity of the first ES film 302a and the etching selectivity of the second ES film 302b can be made different. Thus, when forming holes 304 described later, at least the lowermost layer of the first ES film 302a can survive and the in-surface uniformity of the depth of the air gap patterns can be maintained.

(b) By making the thickness of the first ES film 302a smaller than the thickness of the second ES film 302b, it is possible to reduce the contribution of the second ES film 302b to the increase of the parasitic capacitance between the wirings even when the second ES film 302b remains after being etched.

<First Insulating Film Forming Step S104>

Figure 2D:
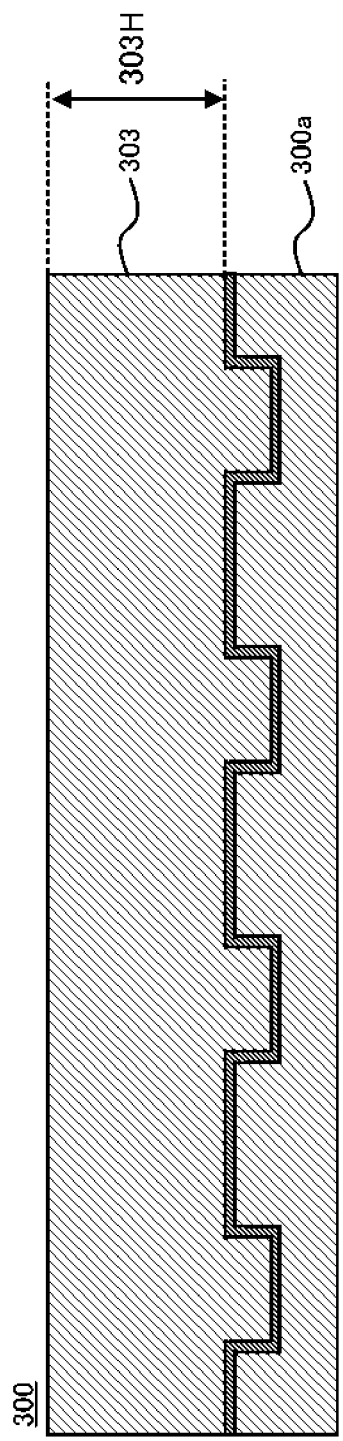

Next, a first insulating film forming step S104 is performed. As shown in FIGS. 2C and 2D, a first insulating film 303 is formed on the substrate 300 with the ES film 302 formed thereon. The first insulating film 303 includes, for example, a carbon-containing silicon oxide film (also referred to as "SiOC film"). The thickness 303H of the first insulating film 303 is greater than the thickness of the wirings.

<Polishing Step S105>

After the first insulating film 303 is formed, the surface of the first insulating film 303 is polished by a polishing apparatus (not shown). As a result, the surface of the first insulating film 303 is planarized.

<Patterning Step S106>

Figure 4A:
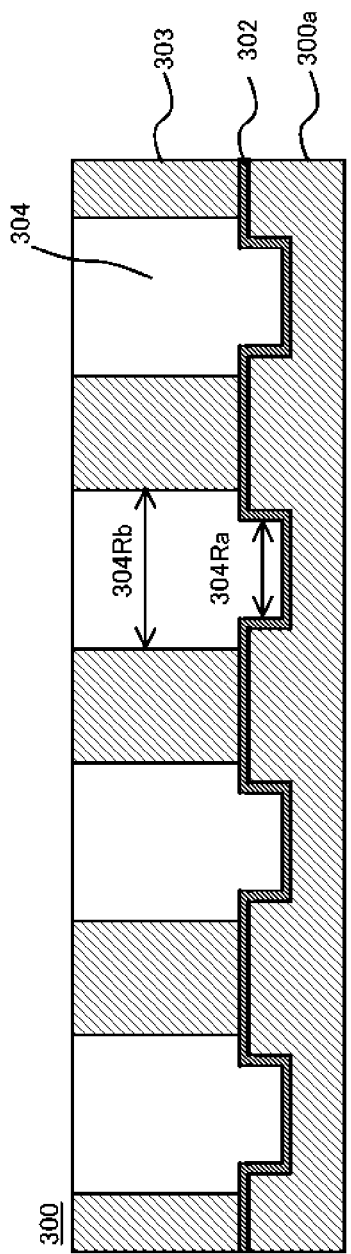
FIGS. 4A through 4C illustrate cross-sectional views of the substrate corresponding to steps S106 through S108 of FIG. 1.

After the polishing step S105 is performed, holes 304 as shown in FIG. 4A for forming the wirings in the first insulating film 303 is formed by an apparatus such as an etching apparatus (not shown). The holes 304 are formed by etching the first insulating film 303 using the ES film 302 as a stopper film. The diameter 304Ra of the holes 304 is smaller than the diameter 304Rb of the holes 304. In the patterning step, the diameter 304Ra refers to the diameter (width) of the first grooves 301 of the surface layer 300a of the substrate 300, and the diameter 304Ra refers to the diameter of the holes 304 formed in the first insulating film 303. By forming the holes 304 as described above, it is possible to suppress the pattern collapse of a wiring film 306 described later formed in the holes 304 and the collapse of air gaps 309 described later.

<Barrier Film Forming Step S107>

Figure 4B:
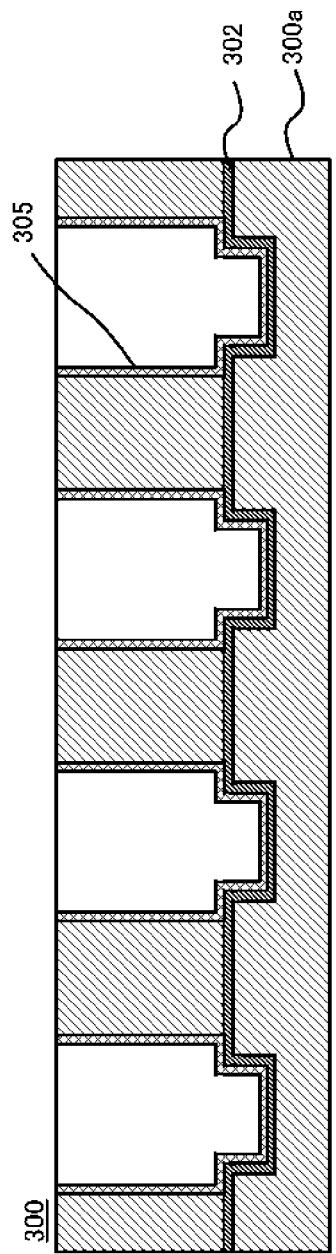

After the patterning step S106 is performed, a barrier film 305 is formed on the surface of the holes 304 as shown in FIG. 4B. An apparatus (not shown) for forming the barrier film 305 may be the same as or different from the substrate processing apparatus 100 described later. The barrier film 305 may include, for example, a titanium (Ti)-containing film. Specifically, the titanium-containing film may include a film such as a titanium film (Ti film), a titanium nitride film (TiN film), a titanium nitride aluminum film (TiAlN film) and any combinations thereof.

<Wiring Film Forming Step S108>

Figure 4C:
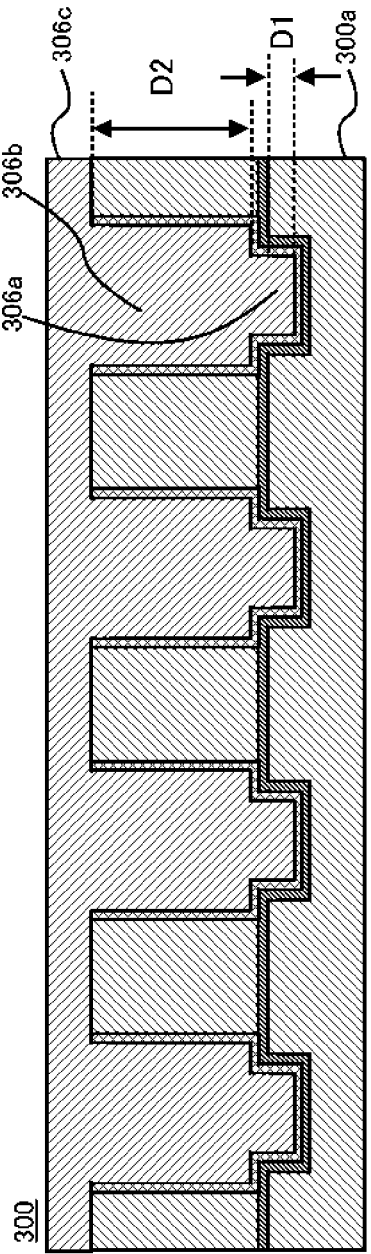

After the barrier film forming step S107 is performed, copper (Cu) films 306a, 306b and 306c are formed in the holes 304 or on the first insulating film 303 as shown in FIG. 4C. In the wiring film forming step S108, the Cu films 306a and 306b constitute the wiring film 306 described later, and the Cu film 306c is removed in a polishing step S109 described later. As described above, since the Cu film 306a at the lowermost portion of the wiring film 306 has a convex shape with respect to the surface layer 300a of the substrate 300, the pattern collapse of the wiring film 306 can be suppressed. Preferably, the depth D1 of the Cu film 306a buried in the first grooves 301 is equal to or less than half of the height D2 of the Cu film 306b. Thereby, the parasitic dielectric constant between the wirings described later can be reduced and made uniform. The Cu films 306a, 306b and 306c are formed, for example, by a plating process (not shown). A step (not shown) for forming a Cu seed may be performed between the barrier film forming step S107 and the plating process.

<Polishing Step S109>

Figure 5A:
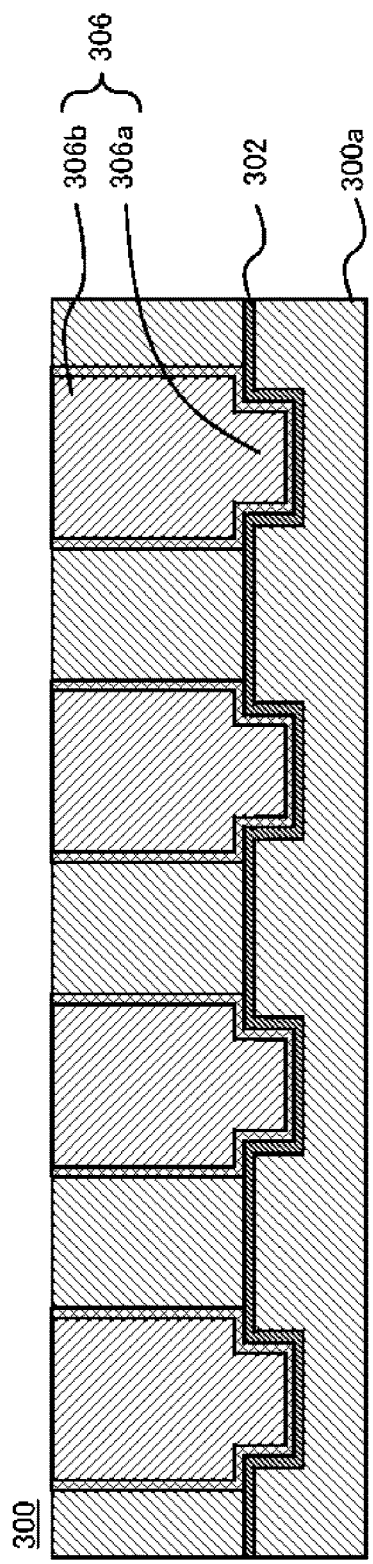
FIGS. 5A and 5B illustrate cross-sectional views of the substrate corresponding to steps S109 and S110 of FIG. 1.

After the wiring film forming step S108 is performed, the Cu film 306c is removed by a polishing apparatus (not shown) as shown in FIG. 5A. Thus, the wiring film 306 is formed. Even though the Cu film 306c is removed by the polishing step S109, it is possible to suppress the collapse of the Cu film 306b by the Cu film 306a formed in the first grooves 301.

<Etch Stopper Film Forming Step S110>

Figure 5B:
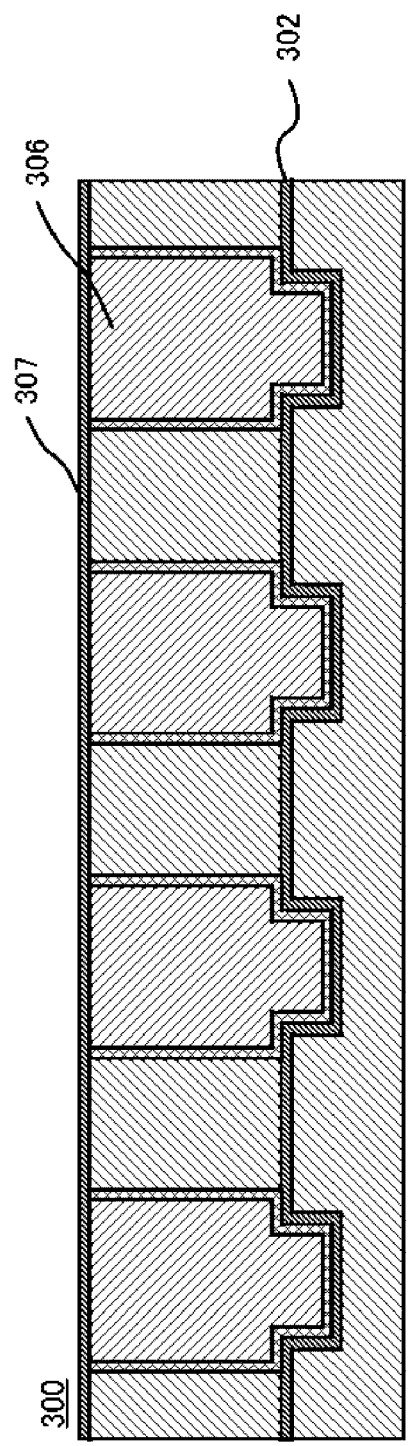

After the polishing step S109 is performed, an etch stopper film (also referred to as "ES film") 307 is formed on the substrate 300 as shown FIG. 5B. The ES film 307 may be the same as the first ES film 302a described above.

<Patterning Step S111>

Figure 6A:
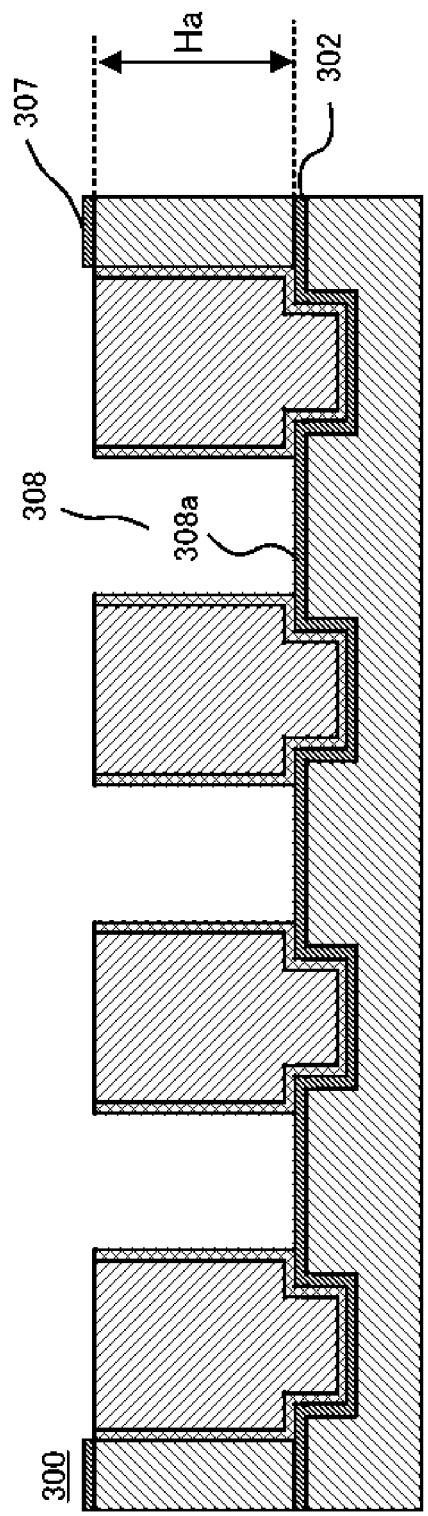
FIGS. 6A and 6B illustrate cross-sectional views of the substrate corresponding to steps S111 and S112 of FIG. 1.
Figure 7A:
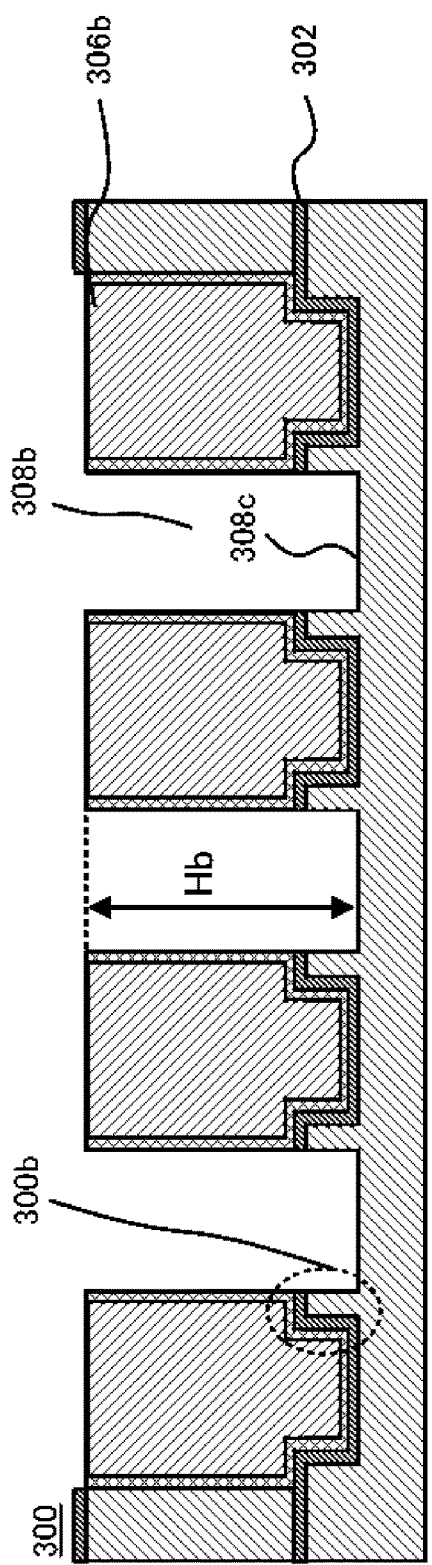
FIGS. 7A and 7B illustrate cross-sectional views of the substrate corresponding to steps S111 and S112 of FIG. 1.

After the etch stopper film forming step S110 is performed, second grooves 308 constituting air gaps are formed by an apparatus (not shown) as shown in FIG. 6A. Bottom portions 308a of the second grooves 308 are defined by a top surface of the first ES film 302a. Side portions of the second grooves 308 are defined by the barrier film 305. That is, the first ES film 302a is exposed at the bottom portions 308a of the second grooves 308. Alternatively, the wiring film 306 is etched to the height of the bottoms of the first grooves 301 so that bottom portions 308c of the second grooves 308b are defined by the surface layer 300a of the substrate as shown in FIG. 7A. That is, the surface layer 300a of the substrate 300 is exposed at the bottom portion 308c of the second grooves 308b just as the surface layer 300a of the substrate 300 is exposed at the bottom portions of the first grooves 301. The second grooves 308 are also referred to as "first holes" and the second grooves 308b are also referred to as "second holes". Preferably, protrusions 300b protruding from the surface layer 300a of the substrate 300 toward the wiring film 306 are formed at the sides of the bottom portions 308c of the second grooves 308b when the second grooves 308b are formed. By forming the protrusions 300b, it is possible to suppress the pattern collapse. The "pattern collapse" in the specification refers to a collapse of a structure such as the wiring film 306 and the barrier film 305 in the subsequent steps of manufacturing semiconductor device. Preferably, the height Hb (depth) of the bottom portions 308c of the second groves 308b as shown in FIG. 7A is higher than the height Ha of the bottom portions 308a of the second groves 308 shown in FIG. 6A described above. That is, the depth Hb of the second grooves 308b (second holes 308b) is deeper than the depth Ha of the second grooves 308 (first holes 308). The depth Ha refers to the distance from the surface of the Cu film 306b to the surface of the bottom portions 308a. The depth Hb refers to the distance from the surface of the Cu film 306b to the surface of the bottom portions 308c. According to above-described configurations, it is possible to suppress the pattern collapse. As described later, since the height Gb of air gaps 309b is higher than the height Ga of the air gaps 309, the parasitic dielectric constant between the wirings can be lowered and device characteristics of the semiconductor device can be improved.

<Second Insulating Film Forming Step (S112)>

Figure 6B:
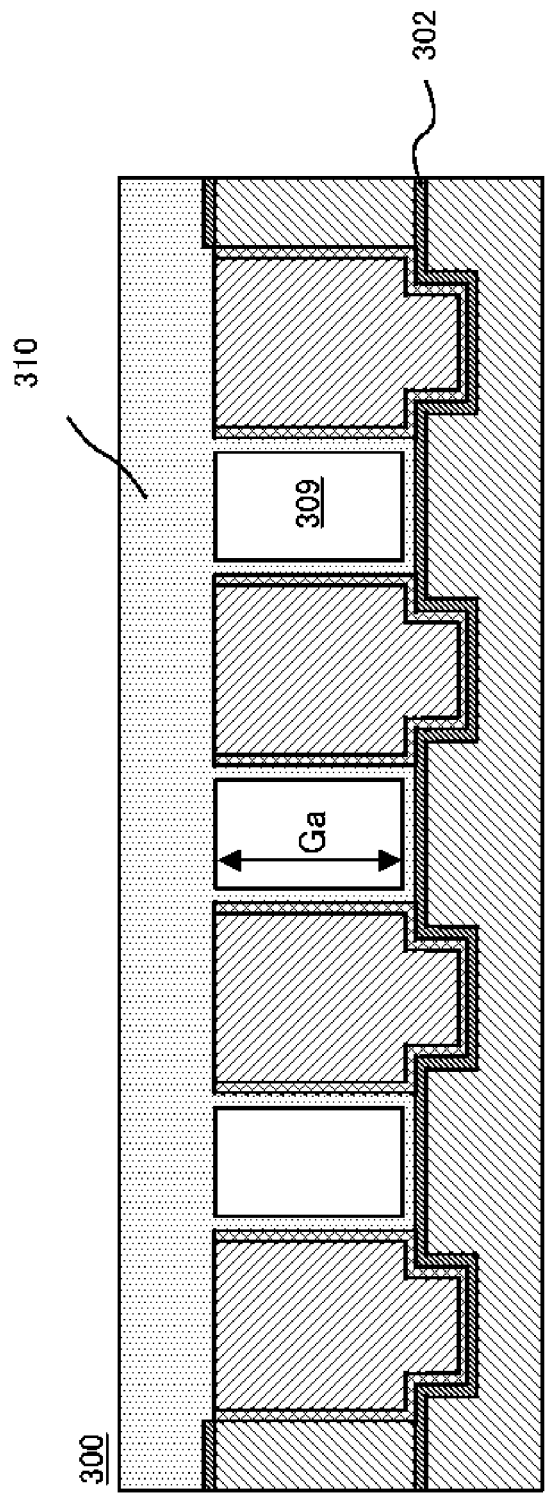
Figure 7B:
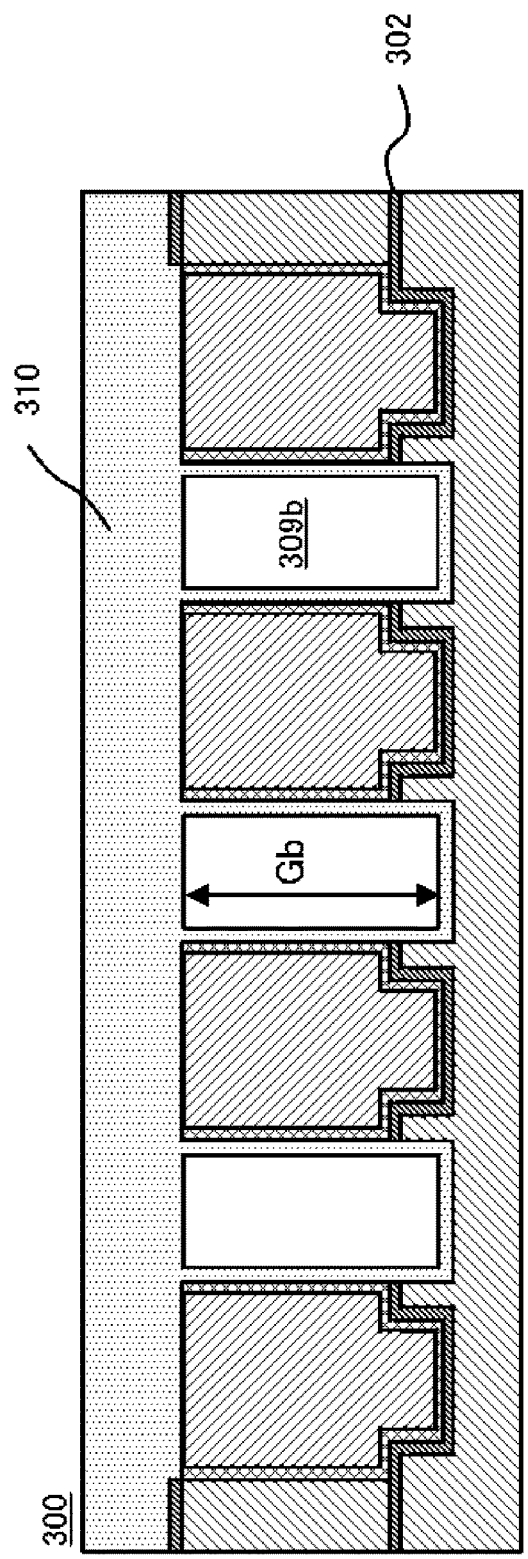

After the second grooves 308 are formed, a second insulating film 310 is formed on the substrate 300. As a result, the air gaps (also referred to as "first air gaps") 309 are formed as shown in FIG. 6B. Alternatively, when the surface layer 300a of the substrate 300 is exposed by the second grooves 308b as shown in FIG. 7A, second air gaps 309b are formed on the substrate 300 as shown in FIG. 7B. Since the volume of the second air gaps 309b is greater than that of the first air gaps 309, the parasitic capacitance between the wirings can be reduced. Further, by forming the protrusions 300b, it is possible to suppress the pattern collapse.

The effect of the air gaps will be described in detail. With recent miniaturization and higher density of the semiconductor device, the distance between the wirings has become narrower. Then, the capacitance between the wirings increases. As a result, a signal delay occurs. In order to reduce the capacitance, a low dielectric constant insulating material may be filled between the wirings as in the conventional art. However, the technology of filling the insulating material between the wirings has reached its limit. By providing voids called "air gaps" between the wirings, the parasitic dielectric constant between the wirings can be lowered and device characteristics of the semiconductor device can be improved.

Next, a substrate processing apparatus 100 preferably used in the first ES film forming step S102 and the second ES film forming step S103 and a method of forming the ES film using the substrate processing apparatus 100 will be described. The method of forming the ES film is a part of a method of manufacturing semiconductor device and is also a part of a substrate processing.

<Substrate Processing Apparatus>

First, the substrate processing apparatus 100 preferably used in the embodiment will be described with reference to FIG. 9. In the embodiment, the substrate processing apparatus 100 is configured to form at least one of the first ES film 302a and the second ES film 302b. Preferably, the substrate processing apparatus 100 is configured to form the first ES film 302a and the second ES film 302b continuously.

Figure 9:
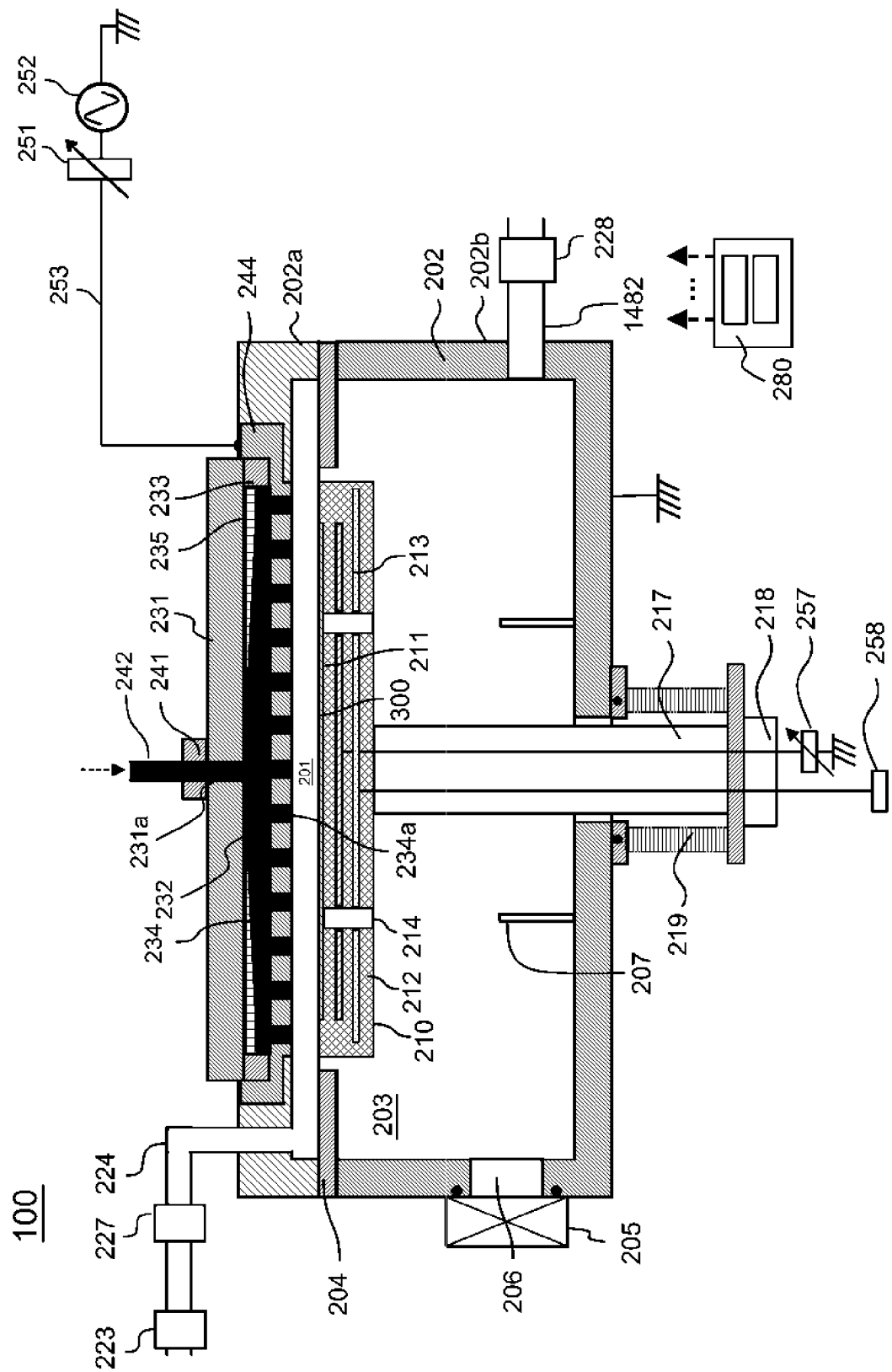
FIG. 9 schematically illustrates a substrate processing apparatus preferably used in the embodiment described herein.

As shown in FIG. 9, the substrate processing apparatus 100 includes a process vessel 202. For example, the process vessel 202 is a flat and sealed vessel having a circular horizontal cross-section. The process vessel 202 is made of a metal such as aluminum (Al) and stainless steel (SUS). A process chamber 201 where the substrate 300 such as a silicon wafer is processed and a transfer chamber 203 wherethrough the substrate 300 is transferred to the process chamber 201 are provided in the process vessel 202. The process vessel 202 includes an upper vessel 202a and a lower vessel 202b. A partition plate 204 is provided between the upper vessel 202a and the lower vessel 202b.

A substrate loading/unloading port 206 is provided at a side wall of the lower vessel 202b adjacent to a gate valve 205. The substrate 300 is moved between a vacuum transfer chamber (not shown) and the transfer chamber 203 through the substrate loading/unloading port 206. Lift pins 207 are provided at the bottom of the lower vessel 202b.

A substrate support 210 is provided in the process vessel 202 to support the substrate 300. The substrate support 210 includes a substrate support member 212 having a substrate placing surface 211 on which the substrate 300 is placed and a heater 213. Through-holes 214 wherethrough the lift pins 207 penetrate are provided in the substrate support 210 at positions corresponding to the lift pins 207. The heater 213 is electrically connected to a heater controller 258. The heater controller 258 is configured to maintain the temperature of at least one of the substrate 300, the heater 213 and the substrate placing surface 211 at a predetermined temperature.

The substrate support member 212 is supported by a shaft 217. The shaft 217 penetrates the bottom of the process vessel 202 and is connected to an elevating mechanism 218 at the outside of the process vessel 202. The substrate 300 placed on the substrate placing surface 211 is elevated and lowered by operating the elevating mechanism 218 by elevating and lowering the shaft 217 and the substrate support member 212. A bellows 219 covers the lower end portion of the shaft 217 to maintain the inside of the process chamber 202 airtight.

When the substrate 300 is transported, the substrate support member 212 is lowered until the substrate placing surface 211 of the substrate support 210 is at a height of the substrate loading/unloading port 206 (hereinafter referred to as "wafer transfer position"). When the substrate 300 is processed, the substrate support member 212 is elevated until the substrate 300 reaches a processing position in the process chamber 201 (hereinafter referred to as "wafer processing position").

Specifically, when the substrate support member 212 is lowered to the wafer transfer position, the upper ends of the lift pins 207 protrude from the upper surface of the substrate placing surface 211, and the lift pins 207 support the substrate 300 from thereunder. When substrate support member 212 is elevated to the wafer processing position, the lift pins 207 are retracted from the upper surface of the substrate placing surface 211 and the substrate placing surface 211 supports the substrate 300 from thereunder.

A shower head 234, which is a gas dispersion mechanism, is provided in the upper portion (at the upstream side) of the process chamber 201. A gas introduction port 231a is provided at a cover 231 of the shower head 234. Gases supplied by a gas supply system of the process vessel 202 described later are supplied into a buffer space 232 via a common gas supply pipe 242 and the gas introduction port 231a and are then supplied to the process chamber 201 via a dispersion plate 234a. Holes are provided at the dispersion plate 234a to face the substrate placing surface 211. An electrode 244 may be provided at the dispersion plate 234a. High frequency power may be applied to the electrode 244. An insulating block 233 is provided between the cover 231 and the electrode 244 when the electrode 244 is provided. A matching mechanism 251 and a high frequency power supply 252 are connected to the electrode 244 through a power supply line 253 when the electrode 244 is provided. When the high frequency power is supplied to the electrode 244, the gas supplied into the process chamber 201 is activated.

<Gas Supply System>

A common gas supply pipe 242 is connected to the gas introduction port 231a provided at the cover 231 of the shower head 234. Various gases are supplied into the shower head 234 through the common gas supply pipe 242 and the gas introduction port 231a.

Figure 10:
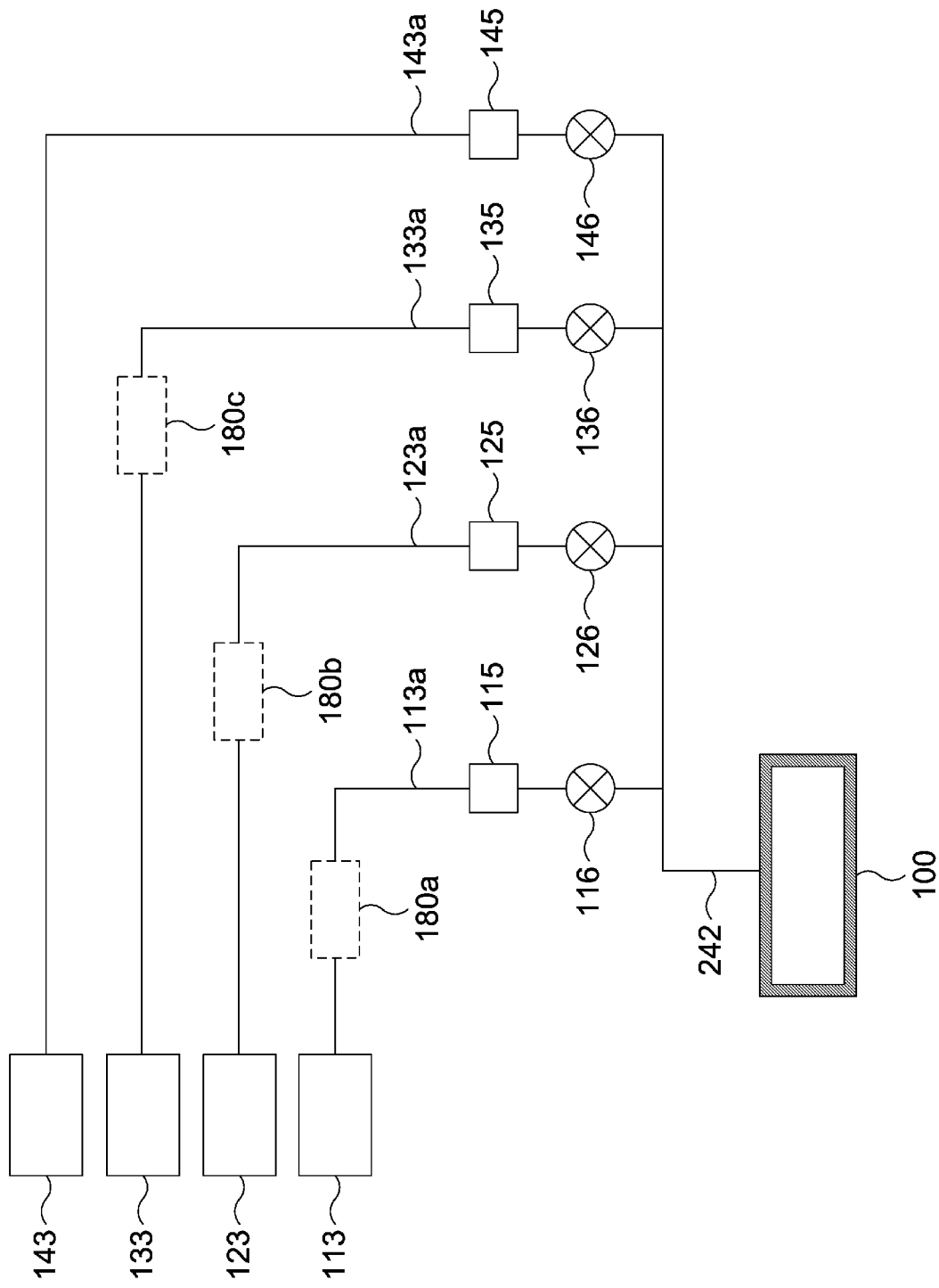
FIG. 10 schematically illustrates a gas supply system of the substrate processing apparatus preferably used in the embodiment.

As shown in FIG. 10, the gas supply system is connected to the common gas supply pipe 242. Specifically, a first gas supply pipe 113a, a second gas supply pipe 123a, a third gas supply pipe 133a and a fourth gas supply pipe 143a are connected to the common gas supply pipe 242.

A first element-containing gas (also referred to as "first process gas" or "first gas") is supplied by a first gas supply system which includes the first gas supply pipe 113a. A second element-containing gas (also referred to as "second process gas" or "second gas") is supplied by a second gas supply system which includes the second gas supply pipe 123a. A third element-containing gas (also referred to as "third process gas" or "third gas") is supplied by a third gas supply system which includes the third gas supply pipe 133a. A fourth element-containing gas is supplied by a fourth gas supply system which includes the fourth gas supply pipe 143a. The gas supply system is constituted by the first gas supply system, the second gas supply system, the third gas supply system and the fourth gas supply system.

<First Gas Supply System>

A first gas supply source 113, a mass flow controller (MFC) 115 serving as a flow rate controller (flow rate control mechanism) and valve 116 serving as an opening/closing valve are provided at the first gas supply pipe 113a in order from an upstream side to a downstream side of the first gas supply pipe 113a.

The first element-containing gas is supplied to the shower head 234 via the mass flow controller 115 and the valve 116 provided at the first gas supply pipe 113a and the common gas supply pipe 242.

According to the embodiment, the first element-containing gas is one of process gases. In the embodiment, the first element-containing gas may include silicon (Si). For example, the first element-containing gas may include a gas such as hexachlorodisilane ($Si_2Cl_6$, abbreviated as HCDS) gas.

Instead of hexachlorodisilane gas, an inorganic halosilane gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane (silicon tetrachloride) ($SiCl_4$, abbreviated as STC) and octachlorotrisilane ($Si_3Cl_8$, abbreviated as OCTS) gas may be used as the first element-containing gas.

Instead of hexachlorodisilane gas, an inorganic source such as monosilane ($SiH_4$, abbreviated as MS) gas, disilane ($Si_2H_6$, abbreviated as DS) gas and trisilane ($Si_3H_8$, abbreviated as TS) gas may be used as the first element-containing gas.

Instead of hexachlorodisilane gas, an aminosilane source gas such as tetrakis dimethyl aminosilane ($Si[N(CH_3)_2]_4$, abbreviated as 4DMAS) gas, tris dimethyl aminosilane ($Si[N(CH_3)_2]_3H$, abbreviated as 3DMAS) gas, bisdiethylaminosilane ($Si[N(C_2H_5)_2]_2H_2$, abbreviated as BDEAS) gas and bis (tertiary-butylamino) silane ($SiH_2[NH(C_4H_9)]_2$, abbreviated as BTBAS) gas may be used as the first element-containing gas.

The first gas supply system is constituted by the first gas supply pipe 113a, the mass flow controller 115 and the valve 116.

The first gas supply system may further include at least one of the first gas supply source 113 and a remote plasma unit (RPU) 180a capable of activating the first element-containing gas (first gas).

<Second Gas Supply System>

A second gas supply source 123, a mass flow controller (MFC) 125 and a valve 126 are provided at the second gas supply pipe 123a in order from an upstream side to a downstream side of the second gas supply pipe 123a.

The second element-containing gas is supplied to the shower head 234 via the mass flow controller 125 and the valve 126 provided at the second gas supply pipe 123a and the common gas supply pipe 242.

According to the embodiment, the second element-containing gas is one of the process gases. The second element-containing gas includes a gas containing carbon (C) such as propylene ($C_3H_6$) gas. The second element-containing gas may include a gas containing carbon (C) and hydrogen (H) such as methane ($CH_4$) gas, ethane ($C_2H_6$) gas and propane ($C_3H_8$) gas.

Instead of the propylene gas, a gas containing carbon (C) and silicon (Si) may be used as the second element-containing gas. For example, 1,4-disilabutane ($Si_2C_2H_{10}$, abbreviated as DSB) gas may be used as the gas containing carbon (C) and silicon (Si).

Instead of the propylene gas, an alkylene halosilane gas such as ethylenebis (trichlorosilane) gas, that is, 1,2-bis (trichlorosilyl) ethane (($SiCl_3)_2C_2H_4$, abbreviated as BTCSE) gas and methylenebis (trichlorosilane) gas, that is, bis (trichlorosilyl) methane (($SiCl_3)_2CH_2$, abbreviated as BTCSM) gas may be used as the second element-containing gas.

Instead of the propylene gas, an alkylhalosilane gas such as 1,1,2,2-tetrachloro-1,2-dimethyldisilane (($CH_3)_2Si_2Cl_4$, abbreviated as TCDMDS) gas, 1,2-dichloro-1,1,2,2-tetramethyldisilane (($CH_3)_4Si_2Cl_2$, abbreviated as DCTMDS) and 1-monochloro-1,1,2,2,2-pentamethyldisilane (($CH_3)_5Si_2Cl$, abbreviated as MCPMDS) gas may be used as the second element-containing gas.

The second gas supply system is constituted by the second gas supply pipe 123a, the mass flow controller 125 and the valve 126.

The second gas supply system may further include at least one of the second gas supply source 123 and a remote plasma unit (RPU) 180b capable of activating the second element-containing gas (second gas).

<Third Gas Supply System>

A third gas supply source 133, a mass flow controller (MFC) 135 and a valve 136 are provided at the third gas supply pipe 133a in order from an upstream side to a downstream side of the third gas supply pipe 133a.

The third element-containing gas is supplied to the shower head 234 via the mass flow controller 135 and the valve 136 provided at the third gas supply pipe 133a and the common gas supply pipe 242.

According to the embodiment, the third element-containing gas (second gas) is one of the process gases. The third element-containing gas includes a gas containing nitrogen (N) such as ammonia ($NH_3$) gas and nitrogen ($N_2$) gas The third gas supply system is constituted by the third gas supply pipe 133a, the mass flow controller 135 and the valve 136.

The third gas supply system may further include at least one of the third gas supply source 133 and a remote plasma unit (RPU) 180c capable of activating the third element-containing gas (third gas). Preferably, the remote plasma unit (RPU) 180c is provided at the third gas supply system to activate the third element-containing gas. The activated third element-containing gas is then supplied to the shower head 234.

<Fourth Gas Supply System>

A fourth gas supply source 143, a mass flow controller (MFC) 145 and a valve 146 are provided at the fourth gas supply pipe 143a in order from an upstream side to a downstream side of the fourth gas supply pipe 143a.

The fourth element-containing gas is supplied to the shower head 234 via the mass flow controller 145 and the valve 146 provided at the fourth gas supply pipe 143a and the common gas supply pipe 242.

For example, an inert gas may be used as the fourth element-containing gas. The inert gas is unlikely to react with the above-described process gases such as the first gas, the second gas and the third gas. The inert gas contains at least one of helium (He), neon (Ne), nitrogen (N) and argon (Ar). For example, nitrogen ($N_2$) gas may be used as the inert gas. The inert gas may be used as a dilution gas for the above-described process gases or a purge gas.

The fourth gas supply system is constituted by the fourth gas supply pipe 143a, the mass flow controller 145 and the valve 146. The fourth gas supply system may further include the fourth gas supply source 143.

<Exhaust System>

An exhaust system exhausts an inner atmosphere of the process chamber 201. The exhaust system includes an exhaust pipe 224 connected to the upper vessel 202a.

The exhaust pipe 224 is provided at the upper vessel 202a. An APC (Automatic Pressure Controller) 227 for adjusting the inner pressure of the process chamber 201 to a predetermined pressure is provided at the exhaust pipe 224. In the specification, the APC 227 is also referred to as "pressure controller". A pump 223 such as a vacuum pump is provided at the downstream side of the APC 227. The pump 223 may include a turbo molecular pump. The APC 227 includes a valve body (not shown) capable of adjusting the degree of opening. The APC 227 adjusts the conductance of the exhaust pipe 224 in accordance with an instruction from a controller 280 described later.

<Transfer Chamber Exhaust System>

A transfer chamber exhaust system exhausts an inner atmosphere of the transfer chamber 203. The transfer chamber exhaust system includes an exhaust pipe 1482 connected to the lower vessel 202b.

The exhaust pipe 1482 is provided at the lower vessel 202b. An APC (Automatic Pressure Controller) 228 for adjusting the inner pressure of the transfer chamber 203 to a predetermined pressure is provided at the exhaust pipe 1482. A pump (not shown) such as a vacuum pump may be provided at the downstream side of the APC 228.

<Controller>

Figure 11:
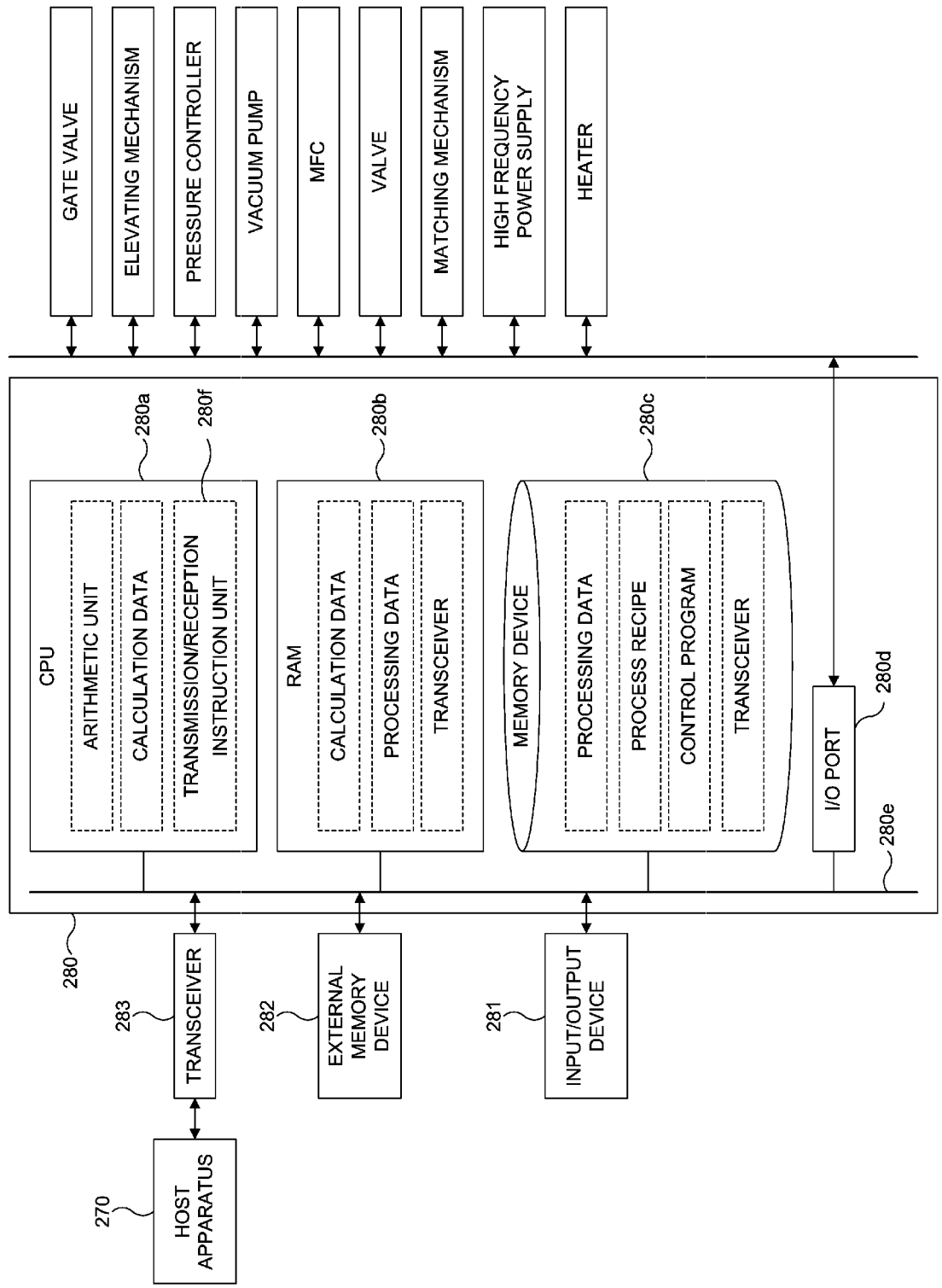
FIG. 11 is a block diagram schematically illustrating a configuration of a controller and components controlled by the controller of the substrate processing apparatus preferably used in the embodiment.

The substrate processing apparatus 100 includes the controller 280 configured to control components thereof. As shown in FIG. 11, the controller 280 includes at least a CPU (Central Processing Unit) 280a serving as an arithmetic unit, a RAM (Random Access Memory) 280b serving as a temporary memory unit, a memory device 280c and an I/O port 280d serving as a transceiver. The controller 280 is connected to the components of the substrate processing apparatus 100 via the I/O port (transceiver) 280d, calls a program or recipe from the memory device 280c in accordance with an instruction of a host controller or a user, and controls the operation of the components of the substrate processing apparatus 100 according to the contents of the instruction. The controller 280 may be embodied by a dedicated computer or as a general-purpose computer. According to the embodiment, the controller 280 may be embodied by preparing an external memory device 282 (e.g. a magnetic tape, a magnetic disk such as a flexible disk and a hard disk, an optical disk such as a CD and a DVD, a magneto-optical disk such as MO and a semiconductor memory such as a USB memory (USB flash drive) and a memory card) storing the program or the recipe. The program or the recipe stored in the external memory device 282 may be called by the RAM 280b or the memory device 280c. The means for providing the program to the controller 280 is not limited to the external memory device 282. The program can be supplied to the controller 280 using communication means such as the Internet and a dedicated line. That is, the program may be provided to the controller 280 without using the external memory device 282 by receiving the information (i.e., program) from a host apparatus 270 via a transceiver 283. A user can input an instruction to the controller 280 using an input/output device 281 such as a keyboard and a touch panel.

The memory device 280c or the external memory device 282 may be embodied by a non-transitory computer readable recording medium. Hereafter, the memory device 280c and the external memory device 282 are collectively referred to as recording media. Herein, "recording media" may refer to only the memory device 280c, only the external memory device 282 or both.

Figure 12:
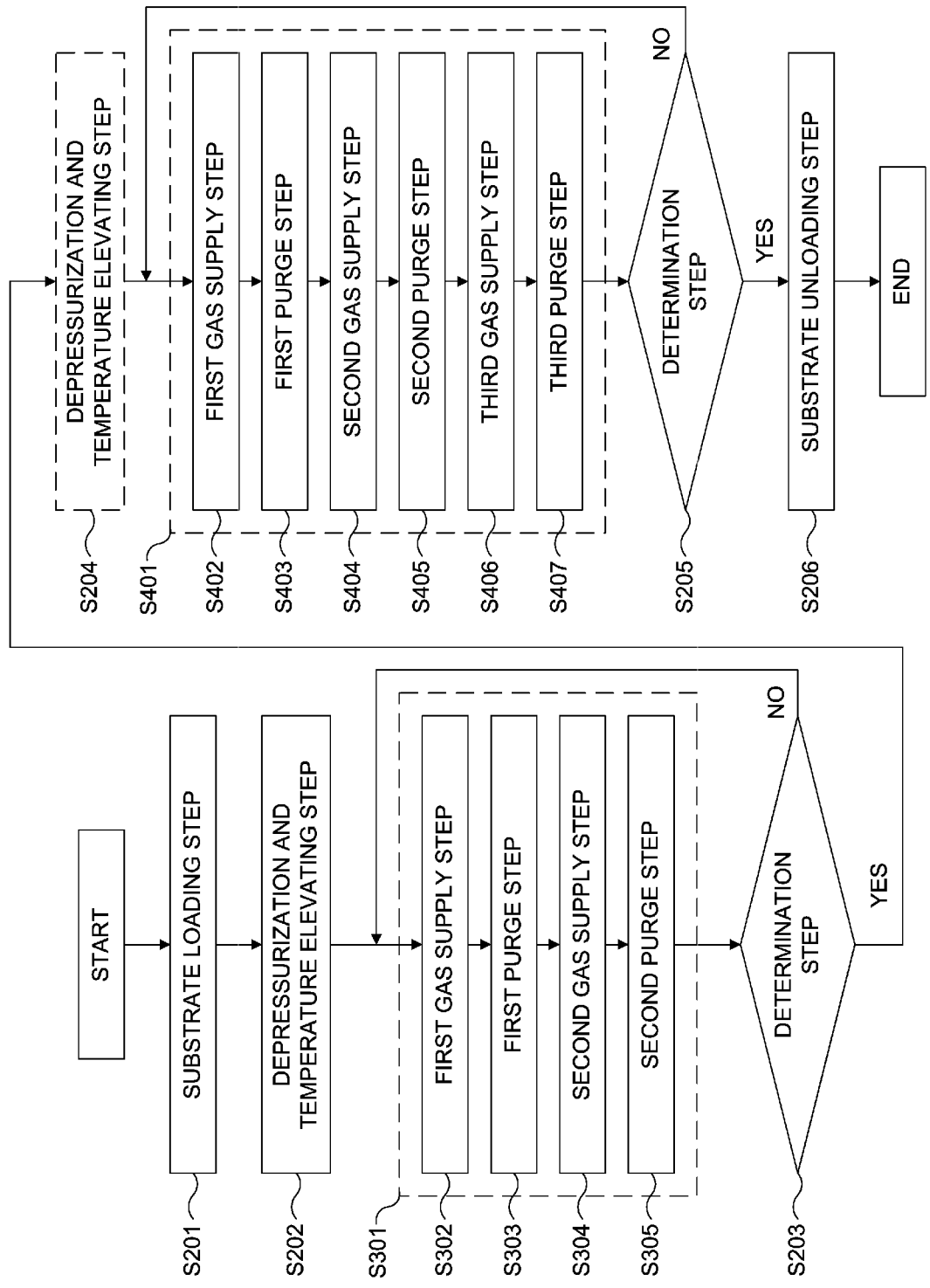
FIG. 12 is a flowchart illustrating an etch stopper film forming process according to the embodiment.

Hereinafter, steps S102 and S103 for forming the first ES film 302a and the second ES film 302b on the substrate 300 loaded into the substrate processing apparatus 100 will be described in detail with reference to FIG. 12. As shown in FIG. 2B, the first grooves 301 are formed on the surface layer 300a of the substrate 300.

Hereinafter, an exemplary method (exemplary substrate processing) wherein HCDS gas, $C_3H_6$ gas and $NH_3$ gas are used as the first process gas, the second process gas and the third process gas, respectively, to form the first ES film 302a and the second ES film 302b will be described in detail.

<Substrate Loading Step S201>

The substrate support member 212 of the substrate processing apparatus 100 is lowered to the position for transferring the substrate 300 (wafer transfer position). The lift pins 207 penetrate the through-holes 214 of the substrate support 210. As a result, the lift pins 207 protrude from the surface of the substrate support member 212. Next, the gate valve 205 is opened to spatially connect a vacuum transfer chamber (not shown) to the transfer chamber 203. The substrate 300 is loaded into the transfer space 203 from the vacuum transfer chamber and placed on the lift pins 207 by a wafer transfer device (not shown). As a result, the substrate 300 is placed onto the lift pins 207 protruding from the surface of the substrate support member 212 and is supported by the lift pins 207 in horizontal orientation.

After the substrate 300 is transferred into the process vessel 202, the wafer transfer device is retracted to the outside of the process vessel 202, and the gate valve 205 is closed to seal the process vessel 202. Thereafter, the substrate support member 212 is elevated to transfer the substrate 300 to the substrate placing surface 211 and then further elevated until the substrate 300 is at the wafer processing position in the process chamber 201.

After the substrate 300 is loaded into the transfer chamber 203 and elevated to the wafer processing position in the process chamber 201, the APC 228 is closed to terminate the exhaust of the transfer chamber 203. The APC 227 is opened to exhaust the process chamber 201. The inner pressure of the process chamber 201 is adjusted to a predetermined pressure (for example, a high vacuum of $10^{-3}$ Pa to $10^3$ Pa) by adjusting the exhaust flow rate of the process chamber 201 by the pump 223 with the APC 227.

When the substrate 300 is placed on the substrate support member 212, electrical power is supplied to the heater 213 in advance to heat the substrate support member 212. Thus, after the substrate 300 is placed on the lift pins 207 or the substrate placing surface 211, the substrate 300 can be heated directly.

<Depressurization and Temperature Elevating Step S202>

Next, the process chamber 201 is exhausted through the exhaust pipe 224 of the process chamber 201 until the inner pressure of the process chamber 201 reaches a predetermined level (vacuum level). At this time, the opening degree of the APC 227 is feedback-controlled based on the pressure measured by a pressure sensor (not shown). The amount of current applied to the heater 213 is feedback-controlled based on the temperature value detected by a temperature sensor (not shown) until the temperature of the substrate 300 reaches a predetermined temperature. The amount of current applied to the heater 213 is feedback-controlled until the temperature of the substrate 300 or the temperature of the substrate support 210 is stable. When gas from members or moisture is present in the process chamber 201, the gas or the moisture may be removed by vacuum-exhaust or purged with the inert gas. The pre-processing step before the film-forming process is now complete. It is preferable that the process chamber 201 is exhausted to a vacuum level as much as possible that may be reached by a single exhaust.

In the depressurization and temperature elevating step S202, the temperature of the heater 213 adjusted by the heater controller 258 ranges from 100° C. to 600° C., preferably from 100° C. to 500° C., more preferably from 250° C. to 450° C. The heater controller 258 compares the temperature information (data) received from the controller 280 and the temperature information detected by the temperature sensor (not shown), and calculates control data for adjusting the temperature of the heater 213. The heater controller 258 changes or maintains the power supplied to the heater 213 based on the control data to control the temperature of the heater 213. The temperature of the heater 213 is maintained at least during a first film-forming step S301 and a second film-forming step S401.

<First Film-Forming Step S301>

Hereinafter, an example of forming a silicon carbide (SiC) film as the first ES film 302a on the substrate 300 as a first process (first film-forming step S301) will be described. The first film-forming step S301 will be described in detail with reference to FIG. 12.

After the substrate 300 is placed on the substrate support 210, and the inner atmosphere of the process chamber 201 is stabilized, steps S302 through S305 of the first film-forming step S301 described below are performed.

<First Gas Supply Step S302>

In the first gas supply step S302, HCDS gas, which is the first gas (first process gas), is supplied into the process chamber 201 by the first gas supply system. Specifically, the HCDS gas is supplied from the first gas supply source 113. The HCDS gas having the flow rate thereof adjusted by the MFC 115 is supplied to the substrate processing apparatus 100. The HCDS gas having the flow rate thereof adjusted is then supplied to the depressurized process chamber 201 through the buffer chamber 232 and the dispersion plate 234a of the shower head 234. The exhaust system continuously exhausts the process chamber 201 such that the inner pressure of the process chamber 201 is maintained at a predetermined pressure. At this time, the HCDS gas is supplied to the substrate 300 in the process chamber 201 at a predetermined pressure (first pressure) ranging from 10 Pa to 1000 Pa for example. By supplying the HCDS gas to the substrate 300, a silicon-containing layer is formed on the substrate 300. In the embodiment, the silicon-containing layer refers to a layer including silicon (Si). The silicon-containing layer may also refers to a layer including silicon and chlorine (Cl). Hereinafter, an example where the silicon-containing layer is a layer containing silicon and chlorine will be described.

<First Purge Step S303>

After the silicon-containing layer is formed on the substrate 300, the valve 116 at the first gas supply pipe 113a is closed to stop the supply of the HCDS gas. The first purge step S303 is performed by stopping the supply of the HCDS gas (first gas) and exhausting the first gas present in the process chamber 201 or the first gas present in the buffer chamber 232 by the exhaust system.

In the first purge step S303, the remaining gas may be extruded by further supplying an inert gas from the fourth gas supply source 143 in addition to exhausting the gas by the vacuum exhaust. In this case, the valve 146 is opened and the flow rate of the inert gas may be adjusted by the MFC 145. The vacuum exhaust may be combined with the supply of the inert gas. In the alternative, the vacuum exhaust and the supply of the inert gas may alternatively be performed. The flow rate of $N_2$ gas, which is a purge gas (inert gas) supplied through the fourth gas supply system, for example, may range from 100 sccm to 20,000 sccm.

After a predetermined time elapses, the supply of the inert gas is stopped by closing the valve 146. However, the inert gas may be continuously supplied by maintaining the valve 146 open.

<Second Gas Supply Step S304>

After the first purge step S303, propylene gas, which is the second gas (second process gas), is supplied into the process chamber 201 by the second gas supply system in the second gas supply step S304. Specifically, the valve 126 is opened to supply propylene gas into the process chamber 201 via the shower head 234. The second gas is also referred to as process gas for processing the substrate 300, or a reactive gas which reacts with the first gas, the silicon-containing layer and the substrate 300. The second gas is a compound containing carbon (C) and is not limited to propylene gas.

In the second gas supply step S304, the MFC 125 adjusts the flow rate of the propylene gas to a predetermined value. For example, the flow rate of the propylene gas may range from 1 sccm to 10,000 sccm.

When the propylene gas is supplied to the silicon-containing layer formed on the substrate 300, the silicon-containing layer is modified to a layer containing silicon and carbon. The layer containing silicon and carbon is also referred to as "SiC layer". The SiC layer having a predetermined thickness and a predetermined distribution is formed depending on the conditions such as the inner pressure of the process chamber 201, the flow rate of the propylene gas and the temperature of the substrate 300.

After a predetermined time elapses, the valve 126 is closed to stop the supply of the propylene gas.

<Second Purge Step S305>

The second purge step S305 is performed in the same sequence as the first purge step S303. For example, the supply of propylene gas is stopped and the propylene gas present in the process chamber 201 or the propylene gas present in the buffer chamber 232 is exhausted by the exhaust system. Purge is performed by supplying the purge gas into the buffer chamber 232 and the process chamber 201.

<Determination Step S203>

After the second purge step S305 is complete, the controller 280 determines whether the cycle (the first film-forming step S301) including the step S302 through the step S305 is performed a predetermined number of times (n times). That is, the controller 280 determines whether a film containing silicon and carbon (SiC film) and having a desired thickness is formed on the substrate 300. The film (SiC film) serving as the first ES film 302a and having the desired thickness may be formed by performing the cycle including the step S302 through the step S305 at least once. It is preferable that the cycle is performed multiple times until the SiC film having the desired thickness is formed on the substrate 300. As described above, the SiC film having the desired thickness is formed on the substrate 300. In the embodiment, the SiC film is a film containing silicon and carbon as its main components. The thickness of the SiC film, for example, may range from 1 Å to 10 Å.

When the controller 280 determines, in the determination step S203, that the cycle is not performed the predetermined number of times ("NO" in FIG. 12), the first film-forming step S301 is repeated. When the controller 280 determines, in the determination step S203, that the cycle is performed the predetermined number of times ("YES" in FIG. 12), the first film-forming step S301 is terminated and the second film-forming step S302 is then performed.

<Second Film-Forming Step S401>

Hereinafter, an example of forming the second ES film 302b on the substrate 300 having the first ES film 302a formed on the surface thereof as a second process (second film-forming step S401) will be described. The second film-forming step S401 will be described in detail with reference to FIG. 12.

After the first film-forming step S301 is performed, the depressurization and temperature elevating step S204 may be performed. The inner pressure of the process chamber 201 or the temperature of the heater 213 may be adjusted to a pressure or a temperature suitable for the second film-forming step S401 in the depressurization and temperature elevating step S204. The depressurization and temperature elevating step S204 is performed in the same sequence as the depressurization and temperature elevating step S202. Preferably, the inner pressure of the process chamber 201 in the depressurization and temperature elevating step S204 is lower than the inner pressure of the process chamber 201 in the depressurization and temperature elevating step S202. Thus, the process gases supplied through the second film-forming step S401 may be easily supplied into the first grooves 301 where the first ES film 302a is formed. As a result, the second ES film 302b may be uniformly formed in the first grooves 301.

After the inner atmosphere of the process chamber 201 is stabilized, steps S402 through S407 of the second film-forming step S401 described below are performed.

<First Gas Supply Step S402>

The first gas supply step S402 is performed in the same sequence as the first gas supply step S202. A silicon-containing layer is formed on the first ES film 302a in the first gas supply step S402.

<First Purge Step S403>

After the silicon-containing layer is formed on the first ES film 302a, the first purge step S403 is performed in the same sequence as the first purge step S303.

<Second Gas Supply Step S404>

After the first purge step S403 is performed, the second gas supply step S404 is performed in the same sequence as the second gas supply step S304. In the second gas supply step S404, propylene gas, which is the second gas (second process gas), is supplied into the process chamber 201. When the propylene gas is supplied to the silicon-containing layer formed on the first ES film 302a, the silicon-containing layer is modified to a layer containing silicon and carbon. The layer containing silicon and carbon (SiC layer) having a predetermined thickness and a predetermined distribution is formed depending on the conditions such as the inner pressure of the process chamber 201, the flow rate of the propylene gas and the temperature of the substrate 300.

After a predetermined time elapses, the valve 126 is closed to stop the supply of the propylene gas.

<Second Purge Step S405>

The second purge step S405 is performed in the same sequence as the first purge step S303.

<Third Gas Supply Step S406>

Next, in the third gas supply step S406, the third gas is supplied to the substrate 300. In the third gas supply step S406, ammonia gas ($NH_3$), which is the third gas (third process gas), is supplied into the process chamber 201 through the third gas supply system. Specifically, the $NH_3$ gas is supplied from the third gas supply source 133 by opening the valve 136. The NH₃ gas having the flow rate thereof adjusted by the mass flow controller (MFC) 135 is supplied to the substrate 300 The NH₃ gas having the flow rate thereof adjusted is then supplied to the depressurized process chamber 201 through the buffer chamber 232 and the dispersion plate 234a of the shower head 234. The exhaust system continuously exhausts the process chamber 201 such that the inner pressure of the process chamber 201 is maintained at a predetermined pressure. At this time, the NH₃ gas is supplied to the substrate 300 in the process chamber 201 at a predetermined pressure (third pressure) ranging from 10 Pa to 1,000 Pa for example. By supplying the NH₃ gas to the substrate 300, the SiC layer on the first ES film 302a is modified to a layer containing silicon, carbon and nitrogen (N). The layer containing silicon, carbon and nitrogen also referred to as "SiCN layer". In the third gas supply step S406, the RPU 180c may be turned on to activate the NH₃ gas, The activated NH₃ gas is then supplied to the substrate 300. Alternatively, a high-frequency power may be supplied from the high frequency power supply 252 to the electrode 244 to generate plasma of NH₃ gas in the process chamber 201. By activating the NH₃ gas, it is possible to improve the efficiency of removing impurities contained in SiC layer or the nitriding efficiency of the SiC layer.

<Third Purge Step S407>

After the third gas supply step S406 is performed, the third purge step S407 is performed in the same sequences as the first purge step S403 and the second purge step S405.

<Determination Step S205>

After third purge step S407 is complete, the controller 280 determines whether the cycle (the second film-forming step S401) including the step S402 through the step S407 is performed a predetermined number of times (n times). That is, the controller 280 determines whether a film containing silicon, carbon and nitrogen (SiCN film) and having a desired thickness is formed on the substrate 300, that is, on the first ES film 302a. The film (SiCN film) serving as the second ES film 302b and having the desired thickness may be formed by performing the cycle including the step S402 through the step S407 at least once. It is preferable that the cycle is performed multiple times until the SiCN film having the desired thickness is formed on the substrate 300. As described above, the SiCN film having the desired thickness is formed on the substrate 300. In the embodiment, the SiCN film is a film containing silicon, carbon and nitrogen as its main components. The thickness of the SiCN film, for example, may range from 1 Å to 10 Å. The thickness of the SiCN film is greater than that of the first ES film 302a.

When the controller 280 determines, in the determination step S205, that the cycle is not performed the predetermined number of times ("NO" in FIG. 12), the second film-forming step S401 is repeated. When the controller 280 determines, in the determination step S205, that the cycle is performed the predetermined number of times ("YES" in FIG. 12), the second film-forming step S401 is terminated and a substrate unloading step S206 is then performed.

<Substrate Unloading Step S206>

In the substrate unloading step S206, the substrate 300 is unloaded from the substrate processing apparatus 100 in the order reverse to that of the substrate loading step S201. Specifically, the substrate support 210 is lowered to move the substrate 300 from the process chamber 201 to the transfer chamber 203. After the substrate 300 is moved to the transfer chamber 203, the substrate 300 is unloaded from the transfer chamber 203 to the vacuum transfer chamber (not shown).

The substrate processing is performed as described above.

OTHER EMBODIMENTS

While the technique is described in detail by way of the above-described embodiment, the above-described technique is not limited thereto. The above-described technique may be modified in various ways without departing from the gist thereof.

Figure 8:
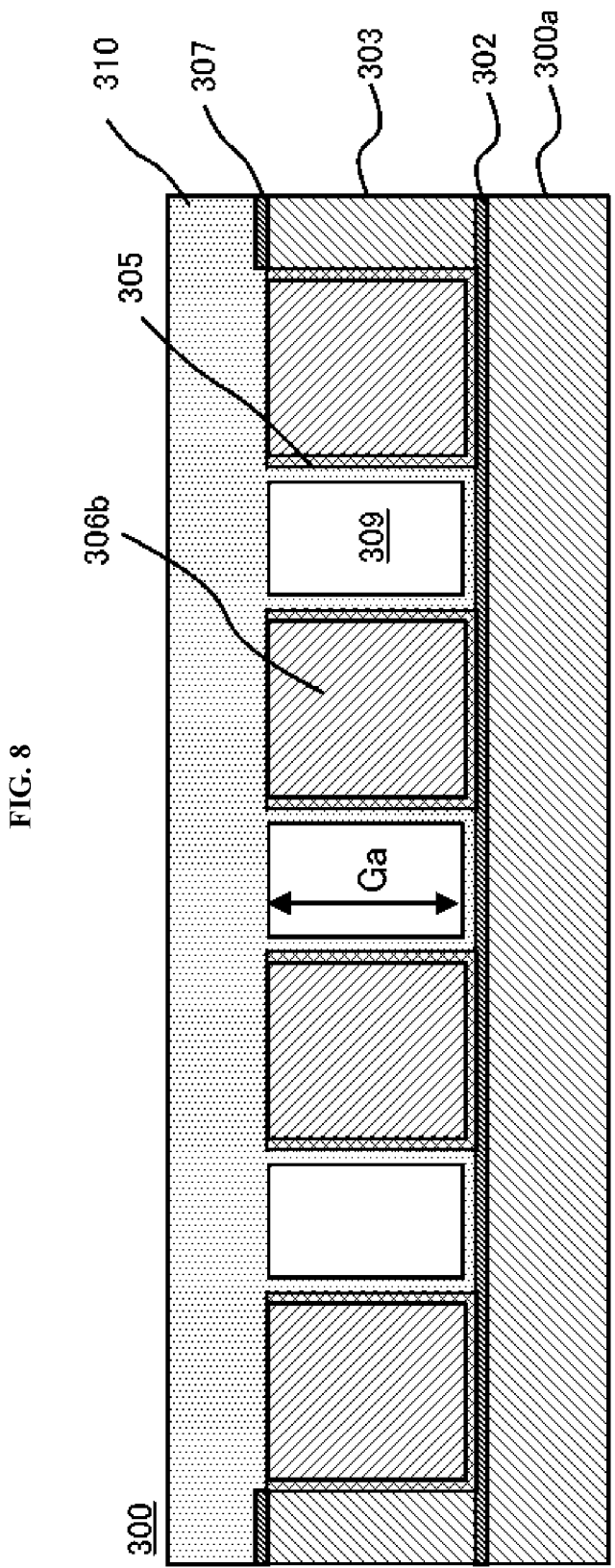
FIG. 8 illustrates a cross-sectional view of the substrate according to a modified example of the embodiment.

For example, it is also possible that the grooves 301 shown in FIG. 8 is not formed in the surface layer 300a of the substrate 300. In this case, the effect of reducing the pattern collapse of the wiring film 306 and the air gaps 309 may become weaker compared with the above-described embodiment. However, by forming the stacked etch stopper film 302, it is possible to improve the uniformity of the depth of the holes formed before the air gaps 309 are formed.

While a method of forming a film wherein the first gas, the second gas and the third gas are sequentially supplied in a non-overlapping manner is exemplified above, the above-described technique may be applied to other methods of forming a film. For example, the above-described technique may be applied even when the supply of the first gas and the supply of the second gas partially overlap. Specifically, the above-described technique may be applied to a CVD (Chemical Vapor Deposition) method and a cyclic CVD method. By using the CVD method, the time required for the substrate processing may be shortened.

While a film-forming process is exemplified above, the above-described technique may be applied to other processes. For example, the above-described technique may also be applied to diffusion process, oxidation process, nitridation process, oxynitridation process, reduction process, oxidation-reduction process and heating process using plasma. The above-described technique may also be applied to plasma oxidation or plasma nitridation of a film formed on a substrate using only a reactive gas. The above-described technique may also be applied to the plasma annealing process using only the reactive gas. That is, the etch stopper layer may be formed by modifying the surface of the surface layer 300a of the substrate 300.

While the manufacturing process of a semiconductor device is exemplified above, the above-described technique may be applied to other manufacturing processes. For example, the above-described technique may be applied to a substrate processing such as a manufacturing process of a liquid crystal device, a manufacturing process of a solar cell, a manufacturing process of a light emitting device, a manufacturing process of a glass substrate, a manufacturing process of a ceramic substrate and a manufacturing process of a conductive substrate.

While a film containing silicon (Si) is formed as the etch stopper film according to the above-describe embodiment, the above-described technique may be applied to methods for forming other films using different gases. For example, the above-described technique may also be applied to a formation of an oxygen-containing film, a formation of a nitrogen-containing film, a formation of a carbon-containing film, a formation of a boron-containing film and a formation of a metal-containing film and a formation of a film containing at least two of these elements. The above-described technique may also be applied to a formation of AlO film, ZrO film, HfO film, HfAlO film, ZrAlO film, SiBN film, TiN film, TiC film and TiAlC film.

While a substrate processing apparatus capable of processing one substrate in one process chamber is exemplified above, the above-described technique is not limited thereto and may be applied to other substrate processing apparatuses. For example, the above-described technique may also be applied to a substrate processing apparatus capable of processing a plurality of substrates arranged horizontally or vertically.

According to the technique described herein, it is possible to provide a semiconductor device having good characteristics

What is claimed is:

1. A method of manufacturing a semiconductor device, comprising:
    (a) loading a substrate into a process chamber; and
    (b) forming a stacked etch stopper film comprising a first etch stopper film free of a third element and a second etch stopper film formed on the first etch stopper film and containing the third element by performing: (b-1) forming the first etch stopper film containing a first element and a second element by supplying a first element-containing gas and a second element-containing gas onto the substrate; and (b-2) the forming the second etch stopper film containing the first element, the second element and the third element by supplying the first element-containing gas, the second element-containing gas and a third element-containing gas onto the first etch stopper film.

2. The method of claim 1, wherein first grooves are formed on a surface of the substrate, and the first etch stopper film is formed on the surface of the substrate and surfaces of the first grooves.

3. The method of claim 2, further comprising:
    (c) forming the first grooves before performing (b-1).

4. The method of claim 1, wherein a thickness of the first etch stopper film is smaller than a thickness of the second etch stopper film in (b).

5. The method of claim 2, wherein a thickness of the first etch stopper film is smaller than a thickness of the second etch stopper film in (b).

6. The method of claim 3, wherein a thickness of the first etch stopper film is smaller than a thickness of the second etch stopper film in (b).

7. The method of claim 1, further comprising:
    (d) forming a wiring film after performing (b-2).

8. The method of claim 2, further comprising:
    (d) forming a wiring film after performing (b-2).

9. The method of claim 3, further comprising:
    (d) forming a wiring film after performing (b-2).

10. The method of claim 4, further comprising:
    (d) forming a wiring film after performing (b-2).

11. The method of claim 5, further comprising:
    (d) forming a wiring film after performing (b-2).

12. The method of claim 6, further comprising:
    (d) forming a wiring film after performing (b-2).

13. The method of claim 7, wherein the wiring film is formed between insulating films in (d) after the insulating films are formed on the first grooves, the method further comprising: (e) exposing the second etch stopper film by etching the insulating films after performing (d).

14. The method of claim 8, wherein the wiring film is formed between insulating films in (d) after the insulating films are formed on the first grooves, the method further comprising: (e) exposing the second etch stopper film by etching the insulating films after performing (d).

15. The method of claim 12, wherein the wiring film is formed between insulating films in (d) after the insulating films are formed on the first grooves, the method further comprising: (e) exposing the second etch stopper film by etching the insulating films after performing (d).

16. The method of claim 13, wherein the first etch stopper film is exposed in (e).

17. The method of claim 15, wherein the first etch stopper film is exposed in (e).

18. The method of claim 7, wherein insulating films are formed on first grooves and the wiring film is formed between the insulating films in (d), the method further comprising:
    (f) forming second grooves by etching the insulating films, the stacked etch stopper film and a surface layer of the substrate after performing (d) such that bottom portions of the second grooves are located higher than bottom portions of the first grooves.

19. The method of claim 14, further comprising: (f) forming second grooves by etching the insulating films, the stacked etch stopper film and a surface layer of the substrate after performing (d) such that bottom portions of the second grooves are located higher than bottom portions of the first grooves.

20. The method of claim 17, further comprising: (f) forming second grooves by etching the insulating films, the stacked etch stopper film and a surface layer of the substrate after performing (d) such that bottom portions of the second grooves are located higher than bottom portions of the first grooves.

* * * * *